United States Patent [19]
Bennett et al.

[11] Patent Number: 6,130,026
[45] Date of Patent: Oct. 10, 2000

[54] WATERLESS LITHOGRAPHIC PLATES

[75] Inventors: Peter Andrew Reath Bennett, Harrogate; Carole-Anne Smith, Edinburgh, both of United Kingdom

[73] Assignee: Kodak Polychrome Graphics LLC, Norwalk, Conn.

[21] Appl. No.: 09/011,590

[22] PCT Filed: Aug. 13, 1996

[86] PCT No.: PCT/GB96/01973

§ 371 Date: Feb. 11, 1998

§ 102(e) Date: Feb. 11, 1998

[87] PCT Pub. No.: WO97/07986

PCT Pub. Date: Mar. 6, 1997

[30] Foreign Application Priority Data

Aug. 15, 1995 [GB] United Kingdom .................. 9516723

[51] Int. Cl.[7] .................................................. G03F 7/004
[52] U.S. Cl. ........................................................... 430/303
[58] Field of Search .......................... 430/270.1, 271.1, 430/272.1, 303

[56] References Cited

U.S. PATENT DOCUMENTS

| | | | |
|---|---|---|---|
| 3,865,588 | 2/1975 | Ohto et al. ................................. | 96/33 |
| 3,901,700 | 8/1975 | Yoerger et al. .............................. | 96/1 |
| 3,953,212 | 4/1976 | Miyano et al. ............................. | 96/75 |
| 4,087,584 | 5/1978 | Taniguchi et al. ....................... | 428/422 |
| 4,508,814 | 4/1985 | Sakurai et al. ........................... | 430/303 |
| 4,510,277 | 4/1985 | St. Clair et al. ......................... | 523/454 |
| 4,617,057 | 10/1986 | Plueddemann ............................. | 106/2 |
| 4,708,925 | 11/1987 | Newman .................................. | 430/270 |
| 4,724,195 | 2/1988 | Muller et al. ............................ | 430/192 |
| 4,839,256 | 6/1989 | Muller ....................................... | 430/192 |
| 4,874,686 | 10/1989 | Urabe et al. ............................ | 430/272 |
| 4,997,745 | 3/1991 | Kawamura et al. ..................... | 430/281 |
| 5,006,443 | 4/1991 | Muller ....................................... | 430/192 |
| 5,032,641 | 7/1991 | Nanishi et al. ......................... | 524/544 |
| 5,061,598 | 10/1991 | Abe et al. ................................. | 430/272 |
| 5,266,443 | 11/1993 | Higashi et al. ......................... | 430/272 |
| 5,378,580 | 1/1995 | Leenders .................................. | 430/303 |
| 5,713,287 | 2/1998 | Gebart ....................................... | 101/467 |
| 5,858,626 | 1/1999 | Sheriff et al. ........................... | 430/326 |
| 5,968,709 | 10/1999 | Verschueren et al. ................ | 430/272.1 |

FOREIGN PATENT DOCUMENTS

| | | | |
|---|---|---|---|
| 0044220 | 1/1982 | European Pat. Off. .......... | B41N 1/14 |
| 0 410 760 | 1/1991 | European Pat. Off. ........ | G03F 7/075 |
| 0 512 845 | 11/1992 | European Pat. Off. ........ | G03F 7/004 |
| 0 539 227 | 4/1993 | European Pat. Off. ........ | G03F 7/075 |
| 0560347 | 9/1993 | European Pat. Off. .......... | B41N 3/03 |
| 4207 264 | 9/1993 | Germany . | |

*Primary Examiner*—Janet Baxter
*Assistant Examiner*—Barbara Gilmore
*Attorney, Agent, or Firm*—Ratner & Prestia

[57] ABSTRACT

A method for preparing a waterless lithographic plate is disclosed. A mixture that contains a water-repellant release material and a compound that becomes aqueous developable on heating is coated on a support, heated imagewise, and developed to produce the printing plate. Preferred water-repellant release materials are acrylic and methacrylic polymers with fluorinated side chains and silicone containing polymers, especially organo functional siloxanes. Preferred compounds that become aqueous developable on heating are phenolic resins as well as complexes of phenolic resins with quinolinium compounds, benzothiazolium compounds, pyridinium compounds, and imidazoline compounds.

16 Claims, No Drawings

6,130,026

WATERLESS LITHOGRAPHIC PLATES

This application is a 371 of PCT/GB96/00001 Aug. 13, 1996.

FIELD OF THE INVENTION

This invention relates to the production of so-called water-less lithographic plates.

BACKGROUND OF THE INVENTION

Lithographic plates may be divided into two classes. Those which require dampening water which is fed to the non-image areas of the plate, forms a water film and acts as an ink-repellant layer; this is the so-called fount solution and those which require no fount solution are called driographs or water-less lithographic plates. Most lithographic plates at present in use are of the first type and require a fount-solution during printing. However, lithographic plates of this type suffer from a number of disadvantages. Some of these are:

a) adjustment of the proper ink-water balance during press operation is difficult and requires great experience. If the correct ink-water balance is not achieved scumming is occasioned when the printed ink image extends into the non-image areas ruining the printed image.

b) adjustment of the ink-water balance at start-up or re-start up is particularly difficult and can not be stabilised until a large number of sheets have been printed, thus incurring waste, c) the ink tends to become emulsified which leads to poor adherence of the ink on to the plate which causes problems in color reproduction and in dot reproduction, d) the printing press has to be provided with a dampening system, thus increasing its size and complexity. These dampening solutions contain volatile organic compounds.

e) The plate care chemistry and fount solutions require careful control and selection.

Further plate cleaners contain significant levels of solvent which is not desirable.

However, with water-less plates in which the ink-releasing layer is, for example, a cured silicone layer there is no scumming and clearer images can be produced. Very often water-less plates comprise a base material, for example aluminum plate, on which a photosensitive layer is coated, on this photosensitive layer there is coated a silicone layer. After imagewise exposure and development in which selected areas of the photosensitive composition are altered, the overlying silicone layer is removed and the plate is inked up. The ink adheres only to those areas of the plate not covered by the silicone remaining after development. Thus the plate can be printed without the need to use a fount solution. In practice it is difficult and costly to formulate and manufacture the silicone layer composition with sufficient adhesion to the photosensitive composition in these multi-layer assemblies. Thus the only commercially available water-less lithographic plates are expensive and of complex design.

There exists in patent literature water-less lithographic plate designs which do not exhibit these disadvantages. These inventions disclose photosensitive water-less lithographic plate precursors comprising a support with an oleophilic surface and a single layer, photosensitive, ink-releasing composition such that imagewise exposure causes changes in developer solubility of the composition where development produces an ink accepting image pattern on the uncovered support surface and an ink-releasing non-image area corresponding to unremoved composition.

U.S. Pat. No. 3,953,212 discloses a plate comprising a support and a coating layer of a mixture of a photosensitive material and a silicone rubber. The photosensitive materials utilised in the invention are typical of standard pre-sensitised wet, lithographic printing plates. These include photosolubilising napthoquinonediazide systems and photoinsolubilising systems including diazo compounds and photopolymer systems such as poly vinyl cinnamates and copolymers of acrylates and methacrylates.

SUMMARY OF THE INVENTION

U.S. Pat. No. 4,724,195, U.S. Pat. No. 5,006,443 and U.S. Pat. No. 5,104,961 disclose a single layer waterless plate precursor which comprises a mixture of radiation sensitive material and a class of fluorinated polymers. These fluorinated polymers represent novel release materials over U.S. Pat. No. 3,953,212. A wide range of composition types which are sensitive to UV or Visible light are disclosed as useful in the invention.

EP 0,410,760 discloses single layer photosensitive compositions comprising polysiloxanes and conventional o-quinonediazides. The invention does not relate directly to the production of waterless lithographic plates though certain of the polysiloxane polymers claimed will provide some release properties to the coated composition.

The differentiation between image and non-image areas is made in the exposure process. In conventional waterless lithography a film original is applied to the plate with a vacuum to ensure good contact and the plate is then blanket exposed to a light source, a portion of which is composed of UV radiation. The aforementioned prior art all disclose this imaging process for their plate precursors.

More recent developments in the field of lithographic printing plates have provided imaging devices which allow for the preparation of direct laser written printing forms. Digital imaging information is used to image the plate directly by laser radiation without the need to utilise an imaging master such as a photographic transparency.

DETAILED DESCRIPTION OF THE INVENTION

In addition to UV sensitivity, U.S. Pat. No. 4,724,195, U.S. Pat. No. 5,006,443, U.S. Pat. No. 5,104,961 and EP 0,410,760 additionally disclose the use of visible light to image the plate, including the use of a laser emitting visible radiation. Such precursors would be imageble on commercially available laser imaging devices which use visible light, e.g 488 nm from an Argon ion laser or 532 nm from a Frequency Doubled YAG laser.

However, the imaging devices utilising such laser technology are limited commercially due to cost of the lasers used. Most recently there has been a trend to utilise lasers which emit infra-red radiation.

We have discovered a method of producing waterless lithographic printing plate precursors which are heat imageable and are therefore suitable for imaging by infra-red radiation.

According to the present invention there is provided a method of preparing a water-less lithographic plate which comprises a support having an oleophilic surface there being coated on the oleophilic surface a mixture which comprises as one component an ink-repellent and water-repellent release material or a mixture of such materials, and as the other essential component a water-insoluble composition which is rendered aqueous developable by heat, the ratio of release material to water-insoluble composition in the mixture being from 20 to 80 release material to 80–20 water-insoluble composition by weight, imagewise heating the mixture on the support, developing the mixture with an aqueous developer solution to remove the imagewise heated areas of the mixture, and so to expose the oleophilic surface of the support and leaving the release material and the water-insoluble composition in the unheated areas of the plate so yielding a negative working water-less lithographic plate.

The preferred water-repellent material is a fluorinated resin or polymer. Preferably the fluorinated resin or polymer is a polymerisation product of an acrylic or methacrylic monomer having a perfluoroalkyl group in a side chain. At least one other copolymerisable monomer may also be present.

Commercially available fluorine resins or polymers are available on the market as "ASAHI GUARD AG-710" (manufactured by Asahi Glass Co., Ltd), "ASAHI GUARD AG-550" (manufactured by Asahi Glass Co. Ltd), "DICGURARD F-60" (manufactured by Dainippon Ink and Chemicals, Inc.), "DICGURARD F-70" (manufactured by Dainippon Ink and Chemicals, Inc.) "SCOTCH GUARD FC-282" (manufactured by Sumitomo 3M), "ZEPEL B" and ZONYL 8070' (both manufactured by E.I. Du Pont). Examples of the perfluoroalkyl-bearing monomer are (perfluorononyl)ethyl acrylate, (perfluorononyl)ethyl methacrylate, (perfluoroisononyl)ethyl acrylate, (perfluoroisononyl)-ethyl methacrylate, (perflurooctyl)ethyl acrylate, (perfluorooctyl)ethyl methacrylate, (perfluoroheptyl)ethyl acrylate, (perfluoroheptyl(ethyl methacrylate, etc. Examples of the other copolymerisable monomer which may be present include styrene, acrylonitrile, acrylic acid and methacrylic acid and their esters such as alkyl esters (e.g. methyl ester, ethyl ester, propyl ester, butyl ester, isobutyl ester, 2-ethylhexyl ester, hexyl ester, decyl ester, lauryl ester, stearyl ester), hydroxyalkyl esters (e.g. β-hydroxyethyl ester) and glycidyl ester. The proportion of these monomers may be optionally selected, but the amount of the perfluoroalkyl-bearing monomer should be not less than 50% by weight on the basis of the amount of the entire monomers.

These fluorinated resins are described in U.S. Pat. No. 4508814 to Nippon Paint which describes a process wherein a water-soluble photosensitive compound is used to prepare either a negative working plate or a positive working plate.

Other suitable fluorine resins are described in U.S. Pat. No. 4,087,584 and in U.S. Pat. No. 4,724,195.

Suitable silicones for use in the present invention are described in for example U.S. Pat. No. 4,510,277, U.S. Pat. No. 3,865,588, U.S. Pat. No. 5,266,443 and U.S. Pat. No. 4,874,686.

Examples of useful silicone polymers are organo functional siloxanes. One such siloxane is available from Dow Corning as a 40% solids emulsion under the designation SYL OFF 7920.

Usefully a curing catalyst may be used in conjunction with the ink-releasing composition. For example, a platinum based catalyst marketed by Dow Corning under the designation SYL OFF 7922 may be used to cure SYL OFF 7920.

A mixture of fluorinated resin and silicone may be used.

A suitable by weight ratio is from 80–20 fluorinated resin to 20–80 silicone.

As the water-insoluble composition which is rendered water-developable by heat there may be used a number of the compositions used to prepare direct positive lithographic plates.

As a suitable heat sensitive substance there may be used a polymeric substance which is water-insoluble when coated as a layer but which when heated is aqueous developable. Such polymeric substances are described in our co-pending application PCT/GB97/01117 (U.S. application Ser. No. 08/981,620, filed Dec. 22, 1997 now abandoned) whose international filing date is Apr. 4, 1997.

In these polymeric substances when they are heated there is merely a change in the solubility differential of the unheated polymeric substance and the heated polymeric substance. In the heated areas the polymeric substance is dissolved away.

Most preferably the polymeric substance is a phenolic resin. The term phenolic resin will be used hereinafter but it is to be understood that other suitable polymeric substances may be used.

The coated plate may be heat imaged using a stylus or any other instrument in which the heat can be directed imagewise.

In order to increase the sensitivity of the heat-sensitive compositions of the present invention it is beneficial to include an additional component, namely a laser radiation absorbing compound capable of absorbing incident radiation and converting it to heat, hereinafter called a "laser-radiation absorbing compound".

Preferably there is coated on the support in addition to the initially developer insoluble phenolic resin a laser-radiation absorbing material and the support is exposed to a laser to heat the coating imagewise.

Most preferably the laser-radiation absorbing material absorbs infra-red radiation and the laser used emits radiation at above 600 nm.

Usefully the infra-red laser-radiation absorbing material is carbon black. Alternatively the infra-red laser-radiation absorbing material is an infra-red absorbing dye.

In one preferred method of the present invention there is coated on the support in addition to the initially developer-insoluble phenolic resin and the infra-red laser-radiation absorbing material a compound which forms a thermally frangible complex with the phenolic resin.

The complex of the developer-insoluble phenolic resin and the compound which forms a thermally frangible complex with the phenolic resin is less soluble in the developer solution than the uncomplexed phenolic resin. However when this complex is imagewise heated the complex breaks down so allowing the non-complexed phenolic resin to be dissolved in the developing solution. Thus the solubility differential between the heated areas of the phenolic resin and the unheated areas is increased when the phenolic resin is complexed.

A large number of compounds which form a thermally frangible complex with the phenolic resin have been located. Examples of such compounds are quinolinium compounds, benzothiazolium compounds, pyridinium compounds and imidazoline compounds.

Examples of suitable quinolinium compounds are 1-ethyl-2-methyl quinolinium iodide, 1-ethyl-4-methyl quinolinium iodide and cyanine dyes which comprise a quinolinium moiety Examples of suitable benzothiazolium compounds are 3-ethyl-(-2 3-ethyl-2(3H)-benzothiazolylidene)-2-methyl-1 (-propenyl) benzothiazolium cationic dyes and 3-ethyl-2-methyl benzothiazolium iodide.

Examples of suitable pyridine compounds are cetyl pyridinium bromide and ethyl viologen dications.

Examples of suitable imidazole compounds are Monazoline C, Monazoline O, Monazoline CY and Monazoline T all of which are manufactured by Mona Industries.

Preferably the laser radiation absorbing material is one whose absorption spectrum is significant at the wavelength output of the laser which is to be used in the method of the present invention.

Preferably the laser emits at above 600 nm as at these wavelengths a significant amount of localised heat is produced.

The laser radiation absorbing material may be carbon such as carbon black or graphite. It may be a commercially available pigment such as Heliogen Green as supplied by BASF or Nigrosine Base NG1 as supplied by NH Laboratories Inc. Usefully it may be a dye or pigment of the squarylium, merocyanine, indolizine, pyrylium or metal dithioline classes.

The method of the present invention yields a negative working water-less lithographic plate in which the composition remaining on the plate constitutes the oleophobic or ink releasing areas of the plate, whilst the areas of the plate from which the photosensitive or heat-sensitive composition was removed by development constitutes the oleophilic areas of the plate.

After the development step and drying, the plate can be inked up. The ink is held in the areas between the portions of ink releasing composition which remain on the plate. No fount solution is required to differentiate between the oleophilic and the ink releasing areas of the plate when printing using an oleophilic printing ink. The oleophilic base used in the method of the present invention is preferably an aluminium plate which will carry on its surface a thin aluminium oxide layer due to action with atmospheric oxygen. This layer may be of increased thickness due to anodising treatment of the base. Post anodic treatment of the base to increase its oleophilicity may be undertaken. Optionally electrochemical etching may precede these processes to improve adhesion between substrate and coating.

Alternatively or in addition the aluminum base may have been coated with a layer which gives the coated base improved oleophilicity over the uncoated base. Examples of such coatings are an oleophilic polymer for example ethyl cellulose, a resol type resin, a polychloroprene or a polyacrylonitrile-butadiene copolymer.

The coating over the aluminum base plate whether treated or not may be a so-called primer layer as described for example in E.P. 44220, U.S. Pat. No. 5,061,598 and E.P. 560347. Such primer layers may comprise a large variety of polymers such as polyester, polyurethanes and polyamides and help to provide a better printing surface than is afforded by uncoated aluminum.

Another base material which may be used in the method of the present invention is a plastics material base or a treated paper base as used as a base in the photographic industry. A particularly useful plastics material base is polyethylene terephthalate which has been subbed render its surface oleophilic. A so-called resin coated paper which has been corona discharge treated may also be used.

An example of a developing solution used in the development step is an aqueous solution of 8% metasilicate, 0.1% of an organic phosphite ester of an ethoxylated alcohol and 0.01% of polyoxy propylene methyl ethyl ammonium chloride. This is hereinafter referred to as Developing solution A.

It is to be noted that the water-less lithographic plate prepared by the method of the present invention is a negative working plate. As the heat-sensitive composition used is a positive working composition it would be thought that a positive working plate would be prepared. The fact that a negative plate is prepared is entirely unexpected. On development it appears that the aqueous alkali developing solution in the treated areas removes both the water-insoluble composition and the water-repellent polymer to reveal the oleophilic surface of the support. Even though the unexposed areas of the plate comprised a high level of water-insoluble composition these areas did not accept ink even though it would be expected that they should.

The accompanying Example will serve to illustrate the invention.

EXAMPLE

Onto a grained oleophilic aluminum plate was coated an IR sensitive composition as follows:

0.54 g LB6564 a phenol cresol novalac resin supplied by Bakelite.
0.06 g NK1144 an IR dye.
0.106 g Polydimethyl siloxane vinyl dimethyl terminated.
0.054 g (30–35%) Methylhydro (65–70%) dimethyl siloxane co-polymer.
1 drop Platinum divinyltetramethyldisiloxane catalyst, 3% in xylene.
2.43 g N-methyl pyrrolidone.
2.43 g MEK After this composition had been coated it was dried at 100° C. for 2 minutes and exposed to an 830 nm IR laser. The plate was then developed in developing solution A at 20° C.

In the exposed areas of the plate the developer was found to have removed the coating to reveal the oleophilic surface of the support.

The sensitivity of the plate was calculated to be at 83 mJ/cm$^2$ or lower.

The negative plate was placed in a printing press and inked-up. More than 1000 prints of good resolution were obtained.

Dye NK1144 has the structure:

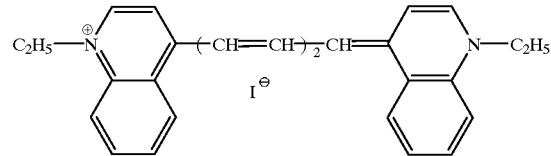

What is claimed is:

1. A method for preparing a waterless lithographic plate, the method comprising:
   (A) imagewise heating a mixture coated on an oleophilic surface of a support and forming heated areas and unheated areas of the mixture on the support; in which:
      (1) the mixture comprises:
         (a) an ink-repellant and water-repellant release material or mixture of such materials, and
         (b) a water-insoluble composition that is rendered aqueous developable by heat, and
      (2) the ratio of release material to water-insoluble composition in the mixture is from 20 to 80 release material to 80 to 20 water-insoluble composition by weight; and
   (B) developing the exposed mixture with an aqueous developer solution and removing the imagewise heated areas and leaving the imagewise unheated areas so as to expose the oleophilic surface of the support in the heated regions.

2. The method of claim 1 in which the water-repellant release material is a fluorinated polymer.

3. The method of claim 2 in which the fluorinated polymer is a polymerization product of an acrylic or methacrylic monomer comprising a perfluoroalkyl side chain.

4. The method of claim 3 in which the fluorinated polymer is a polymerization product of the acrylic or methacrylic monomer and at least one other copolymerizable monomer in which the acrylic or methacrylic monomer is not less than 50% by weight of the monomers.

5. The method of claim 1 in which the water-repellant release material is a silicone containing polymer.

6. The method of claim 5 in which the silicone containing polymer is an organo functional siloxane.

7. The method of claim 6 in which the mixture comprises a platinum curing catalyst for the siloxane.

8. The method of claim 1 in which the release material is a mixture of a fluorinated polymer and a silicone containing polymer.

9. The method of claim 1 in which the heat sensitive composition comprises an infra-red laser-radiation absorbing material.

10. The method of claim 1 in which the water-insoluble composition comprises a polymeric substance that is water-insoluble but which when heated is aqueous developer soluble.

11. The method of claim 10 in which the polymeric substance is a phenolic resin.

12. The method of claim 1 in which the water-insoluble composition comprises:
    an infra-red laser-radiation absorbing material;
    a developer-insoluble phenolic resin; and
    a compound that forms a complex with the phenolic resin;
      in which:
    the complex is less soluble in an aqueous developer solution than uncomplexed resin; and
    the complex breaks down on heating, allowing non-complexed resin to be dissolved in the aqueous developer solution.

13. The method of claim 12 in which the compound that forms the complex with the phenolic resin is a quinolinium compound, a benzothiazolium compound, a pyridinium compound, or an imidazoline compound.

14. The method of claim 12 in which the compound that forms the complex with the phenolic resin is a naphthoquinone diazide sulfonic acid ester of a phenol resin.

15. The method of any one of claims 1, 2–9, 10–11, 12, 13, or 14 in which the imagewise heating is carried out using an instrument in which heat can be directed imagewise.

16. The method of any one of claims 1, 2–9, 10—11, 12, 13, or 14 in which the imagewise heating is carried out by direct application of radiation delivered from a laser that emits radiation at above 600 nm.

* * * * *